United States Patent [19]
Kasai

[11] Patent Number: 5,309,463
[45] Date of Patent: May 3, 1994

[54] LASER DRIVING CIRCUIT

[75] Inventor: Toshio Kasai, Tokyo, Japan

[73] Assignee: Asahi Kogaku Kogyo Kabushiki Kaisha, Tokyo, Japan

[21] Appl. No.: 22,522

[22] Filed: Feb. 25, 1993

[30] Foreign Application Priority Data

Feb. 26, 1992 [JP] Japan .............................. 4-017319[U]

[51] Int. Cl.$^5$ ................................................ H01S 3/10
[52] U.S. Cl. ............................................ 372/38; 372/29
[58] Field of Search ..................................... 372/38, 29

[56] References Cited

U.S. PATENT DOCUMENTS

| | | | |
|---|---|---|---|
| 4,366,529 | 12/1982 | Takahashi et al. | 362/4 |
| 4,727,382 | 2/1988 | Negishi et al. | 346/108 |
| 4,748,633 | 5/1988 | Negishi | 372/38 |
| 4,757,508 | 7/1988 | Zimmerman | 372/38 |
| 4,802,179 | 1/1989 | Negishi | 372/38 |
| 4,878,225 | 10/1989 | Aiba et al. | 372/38 |
| 5,115,147 | 5/1992 | Kusano et al. | 372/29 |
| 5,119,360 | 6/1992 | Minakuchi | 369/116 |
| 5,138,623 | 8/1992 | Ema et al. | 372/38 |
| 5,140,175 | 8/1992 | Yagi et al. | 372/38 |
| 5,153,871 | 10/1992 | Minakuchi | 369/116 |

Primary Examiner—Georgia Y. Epps
Attorney, Agent, or Firm—Sandler, Greenblum & Bernstein

[57] ABSTRACT

A laser driving circuit is provided for driving a laser diode, in which the intensity of the laser beam emitted by the laser diode depends upon the amount of electrical current flowing through the laser diode. The laser driving circuit includes a current source for generating an electrical current to flow through the laser diode, the electrical current being varied in accordance with the voltage applied to the current source. In the laser driving circuit, voltage is applied to the current source in accordance with the intensity of the laser beam emitted by the laser diode. A variable resistor member is further provided for varying the voltage applied to the current source and at least one fixed resistor member is selectively connected in parallel with the variable resistor member for dividing the voltage, varied by the variable resistor member, at a predetermined ratio.

9 Claims, 2 Drawing Sheets

| A | B | SW1 | SW2 | LD OUTPUT |
|---|---|-----|-----|-----------|
| 0 | 0 | OFF | OFF | 0 |
| 0 | 1 | — | — | — |
| 1 | 0 | ON | OFF | LOW |
| 1 | 1 | ON | ON | HIGH |

5,309,463

LASER DRIVING CIRCUIT

BACKGROUND OF THE INVENTION

The present invention relates to a laser driving circuit utilizing a laser diode (semiconductor laser) in which the intensity of the laser beam emitted by the laser diode is regulated.

Conventionally, a laser diode has been used as a light source for emitting laser beam in a laser beam printer and the like. In such a laser beam printer, a laser driving circuit having an APC (Automatic Power Control) function is generally employed in order to control the intensity of the laser beam to be a predetermined value.

There are a plurality of types of laser beam printers, which have photoconductive members having different characteristics. Thus, it is necessary to design a plurality of laser driving circuits each being capable of emitting a desired intensity of laser beam.

Further, there are individual characteristic differences among the same type of laser diodes an/or photodiodes. Accordingly, each laser driving circuit is required to have an adjusting circuit for compensating for the above-described individual characteristic differences.

SUMMARY OF THE INVENTION

It is therefore an object of the present invention to provide an improved laser driving circuit with which the characteristic of each laser driving circuit is easily made uniform regardless of the individual characteristic differences of the laser diode and/or photodiode, and further to provide a circuit capable of easily changing the intensity of the laser beam emitted by the laser driving circuit.

For the above objects, according to the present invention, there is provided a laser driving circuit for driving a laser diode, the intensity of the laser beam emitted by the laser diode depending upon an electrical current flowing therethrough, the laser driving circuit comprising:

current source means for causing an electrical current to flow through the laser diode, the current source varying the electrical current in accordance with the voltage applied thereto;

means for applying voltage in accordance with the intensity of the laser beam emitted by the laser diode;

a variable resistor member connected to the means for applying voltage, the variable resistor member being capable of varying the voltage applied to the current source means; and at least one fixed resistor member selectively connected in parallel with the variable resistor member for dividing the voltage having been varied by the variable resistor member at a predetermined ratio.

According to another aspect of the invention, there is provided a laser driving circuit for driving a laser diode, the intensity of the laser beam emitted by the laser diode depending upon an electrical current flowing therethrough, the laser driving circuit comprising:

means for controlling the electrical current flowing through the laser diode in accordance with voltage applied to the controlling means;

means for generating voltage in accordance with the intensity of the laser beam emitted by the laser diode;

current source means for causing an electrical current to flow through the laser diode;

control means for controlling the amount of the electrical current, the control means having an input terminal to which the voltage generated by the generating means is applied, the amount of the electrical current being controlled in accordance with the voltage applied to the input terminal;

a variable resistor member connected to the input terminal for adjusting the voltage applied thereto; and at least one fixed resistor member selectively connected in parallel to the variable resistance member for dividing the voltage applied to the input terminal at a predetermined ratio.

DESCRIPTION OF THE ACCOMPANYING DRAWINGS

DESCRIPTION OF THE EMBODIMENTS

Figures 1, 2:
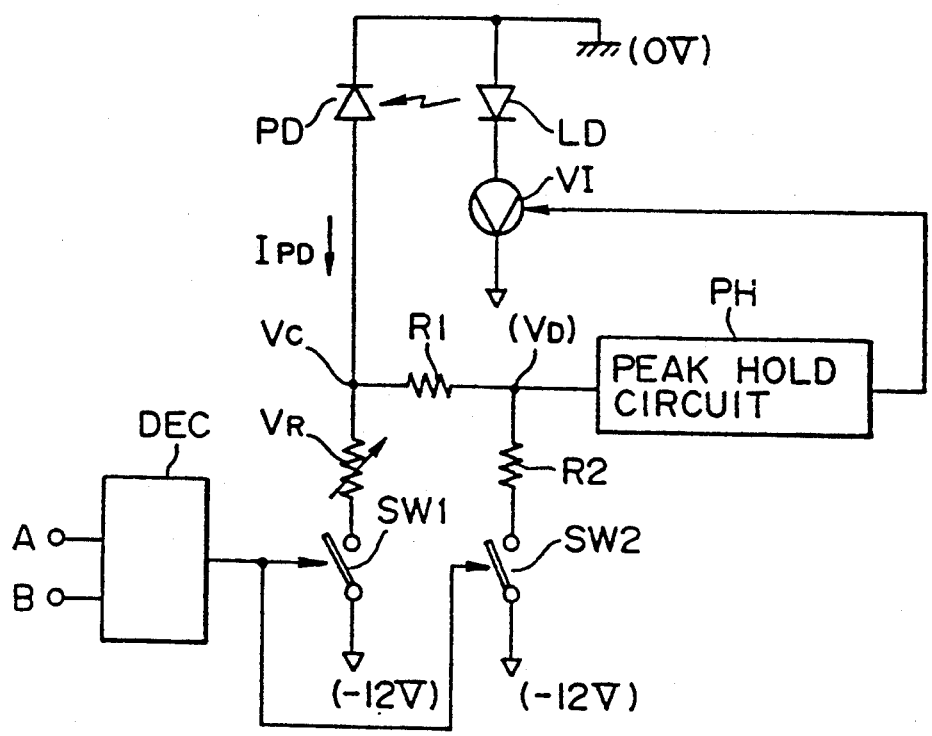
FIG. 1 shows a laser driving circuit according to a first embodiment of the present invention.
FIG. 2 is a table illustrating the relation of the ON-/OFF states of the input/output signal of a decoder and switches 1 and 2.

FIG. 1 shows a laser driving circuit according to a first embodiment of the present invention. The laser driving circuit which has an APC (Automatic Power Control) function includes a laser diode LD, a photodiode PD, an inverse peak hold circuit PH, and a variable current source VI. With the APC function, the intensity of the laser beam emitted by the laser diode LD is controlled to become a predetermined destination intensity.

As shown in FIG. 1, the photodiode PD is connected to a negative voltage source (−12 volts, not shown) through a variable resistor VR and a switch SW1. In parallel with the variable resistor VR and the switch SW1, a series circuit consisting of resistors R1 and R2, and a switch SW2 is connected. The connecting point of the resistors R1 and R2 is connected with the input terminal of the inverse peak hold circuit PH.

Each of the switches SW1 and SW2 includes, for example, a transistor and is electronically closed or opened; i.e., by controlling the voltage applied to the base of the transistor, the transistor is turned ON/OFF between the emitter and the collector.

A decoder DEC outputs, in accordance with the two-bit digital signals A and B, a control voltage to be applied to the base of respective transistors (not shown) of the switches SW1 and SW2. The combination of the two-bit signals A and B, and the ON/OFF condition of the switches SW1 and SW2 controlled by the decoder DEC is indicated in FIG. 2. As shown in FIG. 2, switch SW2 is closed (i.e., turned ON) or opened (i.e., turned OFF) while switch SW1 is closed (i.e., turned ON), or switches SW1 and SW2 are simultaneously opened (i.e., turned OFF).

When the switch SW1 is turned ON, the PD is connected to the negative voltage source through the variable resistor VR. Thus, by varying the resistance of the variable resistor VR, the voltage Vc at the connecting point of the photodiode PD and the variable resistor VR can be adjusted since the voltage fall occurs as electrical current $I_{PD}$ generated by the photodiode PD flows in the variable resistor VR. It is apparent that, constructed as above, the voltage Vc can be adjusted to a desired value regardless of the characteristic differences of the laser diode LD, and/or the photodiode PD. The circuit is designed so that the voltage Vc when the switch SW1 is turned ON corresponds to the electrical current to pass through the laser diode LD in order to emit the laser beam of the minimum intensity within the possibly variable intensity range of the laser beam. In the above-described condition, i.e., when the switch SW1 is turned ON and the switch SW2 is turned OFF, the voltage Vc is applied to the input terminal of the inverse peak hold circuit PH through the resistor R1. Thus the laser diode LD is controlled to emit the laser beam of the minimum intensity as the APC works.

The APC function works as follows.

First, the photodiode PD generates a current in accordance with the intensity of the laser beam emitted by the laser diode LD. When the laser diode LD does not emit a laser beam, since the variable resistor VR is connected with the input terminal of the inverse peak-hold circuit PH through the resistor R1, the inverse peak-hold circuit PH outputs its maximum voltage. Accordingly, the voltage applied to the control terminal of the variable current source VI becomes its largest possible value. The variable current source VI generates electrical current in proportion to the applied voltage (positive voltage), and accordingly a relatively large amount of current flows through the laser diode LD.

Second since a relatively large amount of current flows through the laser diode LD, it emits a relatively strong laser beam, and thus a relatively large amount of current flows through the photodiode PO. This increases the voltage $V_{PD}$ applied to the peak-hold circuit PH. As a result, since the peak-hold circuit PH is an inverse type circuit, the output voltage of the peak-hold circuit PH decreases, thereby decreasing the electrical current generated by the variable current source VI.

Similar steps of increasing and decreasing of the electrical current will occur, and the amplitude of the electrical current concentrates toward a predetermined destination value. In other words, the amplitude of the current is regulated to a predetermined destination valued within a certain response period.

Under this condition, if the switch SW2 is turned ON, the voltage Vc at the point where the variable resistor VR and the photodiode PD are connected is divided by the resistors R1 and R2; the divided voltage $V_D$ which is lower than the voltage Vc is applied to the input terminal of the peak hold circuit PH. Thus, the voltage outputted by the peak hold circuit PH decreases, and the current generated by the variable current source VI is thereby increased. Thus, the intensity of the laser beam emitted by the laser diode LD is increased stepwisely.

In the foregoing description, when only the switch SW1 is closed, the voltage $V_D$ applied to the inverse peak-hold circuit PH equals Vc. If the switches SW1 and SW2 are closed, the combined resistance RR is represented by the following equation:

$$RR = \frac{VR}{1 + VR/(R1 + R2)}$$

The voltage applied to the input terminal of the peak-hold circuit PH when the switches SW1 and SW2 are both closed can be represented by the following equation:

$$VD = Vc \cdot \frac{R2}{R1 + R2}$$

It is apparent from the above equations that if the resistance of the resistors R1 and R2 is much greater than that of the variable resistor VR, the combined resistance RR is substantially equal to VR. If the combined resistance RR is substantially equal to VR, the voltage Vc is deemed to be unchanged regardless whether the switch SW2 is closed or not. Accordingly, it is preferable that the resistances VR, R1 and R2 satisfy the following relation:

$$VR<<R1, VR<<R2.$$

then, regardless whether the switch SW2 is closed or not, the entire resistance would not change, and the voltage Vc also is not change.

As described above, once the resistance of the variable resistor VR is adjusted so that the voltage at the point where the photodiode PD and the variable resister are connected becomes a predetermined value, the intensity of the laser beam emitted by the laser diode LD can be switched between two predetermined values only by operating switched SW1 and SW2. In other words, even if the characteristics of the photodiodes employed in respective laser driving circuits deviate from the specific value, after the voltage Vc of the each laser driving circuit has been adjusted, the intensity of the laser beam selected by the switches can be made substantially constant among the respective laser driving circuits.

In the above-described embodiment, if the switches SW1 and SW2 are opened simultaneously, the input terminal of the peak hold circuit PH is grounded through the photodiode PD. Thus, the voltage of the input terminal of the peak hold circuit PH becomes highest, and therefore, the control voltage applied to the variable current source VI becomes lowest. In such a condition, the current passing through the laser diode LD becomes lower than a threshold value for emitting the laser beam. In other words, by opening the switches SW1 and SW2, the light emitting operation of the laser diode LD is substantially turned OFF.

In the above-described embodiment, by connecting the resistors R1 and R2, dividing the voltage Vc, and divided voltage is applied to the input terminal of the peak hold circuit PD. In order to subside the change of the voltage Vc when the switch SW2 is closed, it is preferable to limit the current flowing through the resistors R1 and R2 as small as possible. Accordingly, in the above-described embodiment, it is preferable to use the resistors having sufficiently greater resistance with respect to that of the variable resistor VR.

Figure 3:
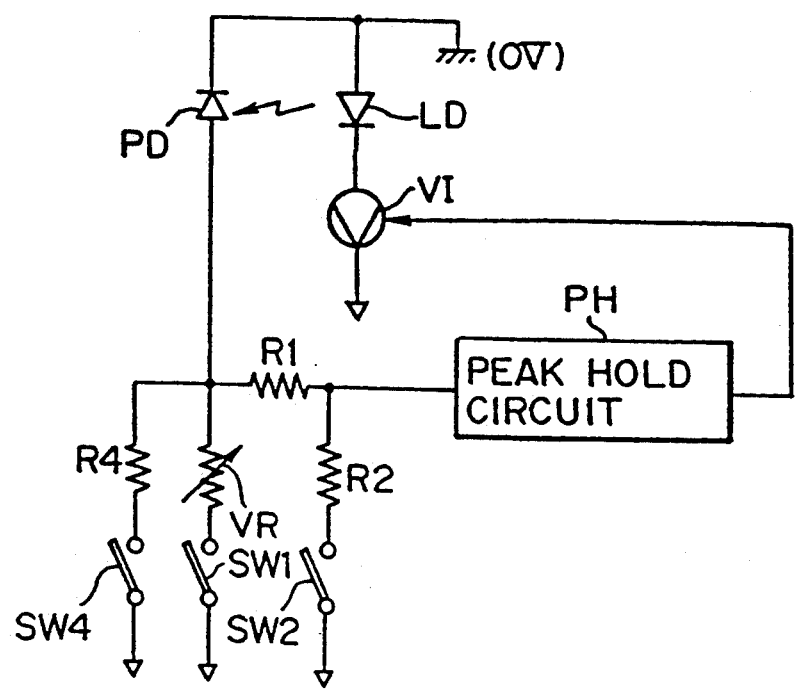
FIG. 3 shows a second embodiment of the present invention.

FIG. 3 shows a second embodiment of the present invention. In this embodiment, a compensation resistor R4 is further connected in parallel with the variable resistor VR. In this second embodiment, the resistor R4 satisfies the following equation:

$$R4 = R1 + R2.$$

That is, the resistor R4 is selected such that the resistance of the resistor R4 is sum of the resistances of the resistors R1 and R2.

First, the voltage Vc is adjusted by closing the switches SW1 and SW4. In other words, the resistance of the variable resistor VR is adjusted with the compensation resistor R4 being connected in parallel with the variable resistor VR. Then, when closing the switch SW2, i.e., the resistor R2 is connected to the resistor R1, if the switch SW4 is opened, since the resistance of the R4 equals the sum of the resistances of the resistors R1 and R2, the variation of the voltage Vc can be prevented. Note that the resistance of the resistor R4 is preferably equal to the sum of the resistances of the resistors R1 and R2, however as far as the resistance of the resistor R4 is close thereto, a considerable effect can be obtained.

Figure 4:
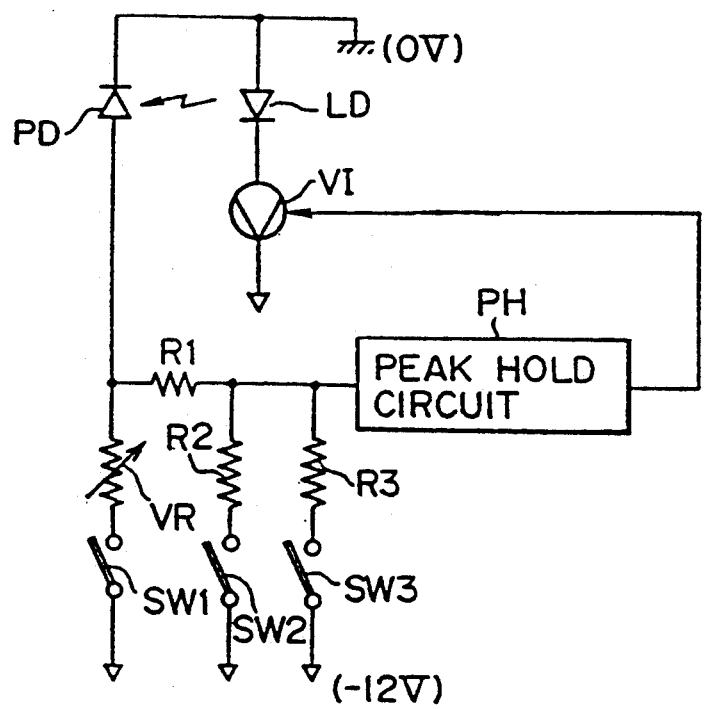
FIG. 4 shows a third embodiment of the present invention.

FIG. 4 shows a third embodiment of the present invention. In the third embodiment, a resistor R3 and a switch SW3 connected in series therewith are added to the first embodiment. By selectively closing the switches SW2 or SW3 with closing the switch SW1, the voltage applied to the input terminal of the peak hold circuit PH can be changed in three stages. If further resistors and switches are provided in the similar manner, the voltage can be adjusted in multiple stages.

In the foregoing embodiments, transistors are used as the switches SW1 through SW4. However, it is also possible to use mechanical switches as the switches SW1 through SW4.

As described above, in the laser driving circuit according to the present invention, once a resistance of a single variable resister is adjusted, the intensity of the laser beam emitted by a laser diode can be switched only by operating switches. Thus, there is no need for provide more than one variable resister. Further, the adjustment of the laser driving circuit can be completed only by adjusting the single variable resister, which facilitates the adjusting operation of the laser driving circuit.

The present disclosure relates to subject matter contained in Japanese Utility Model Application No. HEI 4-17319, filed on Feb. 26, 1992, which is expressly incorporated herein by reference in its entirety.

What is claimed is:

1. A laser driving circuit for driving a laser diode, an intensity of a laser beam emitted by said laser diode depending upon en electrical current flowing through said laser diode, said laser driving circuit comprising:
   current source means for generating an electrical current to flow through said laser diode, said current source means varying said electrical current in accordance with a voltage applied thereto;
   means for applying voltage to said current source means in accordance with the intensity of said laser beam emitted by said laser diode;
   a variable resistor member connected to said voltage applying means for varying said voltage applied to said current source means; and
   at least one fixed resistor member selectively connected in parallel with said variable resistor member for dividing said voltage varied by said variable resistor member at a predetermined ratio.

2. The laser driving circuit according to claim 1, wherein said at least one fixed resistor member is connected in parallel with said variable resistor member through a second resistor member.

3. The laser driving circuit according to claim 1, further comprising switch means for selectively connecting said at least one fixed resistor member to said variable resistor member.

4. The laser driving circuit according to claim 1, wherein said at least one fixed resistor member comprises a plurality of fixed resistors that are selectively connected in parallel with said one variable resistor member.

5. The laser driving circuit according to claim 4, further comprising switch means for selectively connecting said plurality of fixed registors in parallel with said variable resistor member.

6. The laser driving circuit according to claim 2, further comprising a third fixed resistor member selectively connected in parallel with said variable resistor, said third resistor member having a resistance that is substantially the same as that of the sum of resistances of said at least one fixed resistor member and said second resistor member, said third resistor member being connected in parallel with said variable resistor member when said at least one fixed resistor member is disconnected from said variable resistor member, and said third resistor member being disconnected from said variable resistor member when said at least one fixed resistor member is connected with said variable resistor member.

7. The laser driving circuit according to claim 1, wherein said voltage applying means comprises a photodiode for receiving the laser beam and generating electrical current corresponding to the intensity of the received laser beam.

8. The laser driving circuit according to claim 1, wherein a resistance of said at least one fixed resistor member is greater than that of said variable resistor member.

9. A laser driving circuit for driving a laser diode, an intensity of a laser beam emitted by said laser diode depending upon an amount of electrical current flowing through said laser diode, said laser driving circuit comprising:
   means for generating voltage in accordance with the intensity of the laser beam emitted by said laser diode;
   current source means for generating an electrical current to flow through said laser diode;
   means for controlling the amount of electrical current flowing through said laser diode, said control means having an input terminal to which the voltage generated by said voltage generating means is applied, said amount of electrical current being controlled in accordance with the voltage applied to said input terminal;
   a variable resistor member connected to said input terminal for adjusting the voltage applied thereto; and
   at least one fixed resistor member selectively connected in parallel to said variable resistor member for dividing the voltage applied to said input terminal at a predetermined ratio.

* * * * *

UNITED STATES PATENT AND TRADEMARK OFFICE
CERTIFICATE OF CORRECTION

PATENT NO.   : 5,309,463
DATED        : May 3, 1994
INVENTOR(S)  : Toshio KASAI

It is certified that error appears in the above-indentified patent and that said Letters Patent is hereby corrected as shown below:

At column 5, line 45 (claim 1, line 3) of the printed patent, change "en" to --an--.

At column 6, line 14 (claim 5, line 3) of the printed patent, change "registors" to --resistors--.

Signed and Sealed this

Tenth Day of October, 1995

*Attest:*

BRUCE LEHMAN

*Attesting Officer*        *Commissioner of Patents and Trademarks*